(12) United States Patent
Xu et al.

(10) Patent No.: US 12,687,320 B2
(45) Date of Patent: Jul. 21, 2026

(54) DRIVING PART OF WARM AIR HEATER AND WARM AIR HEATER

(71) Applicant: Shanghai Kohler Electronics, Ltd., Shanghai (CN)

(72) Inventors: Houyong Xu, Shanghai (CN); Yan She, Shanghai (CN)

(73) Assignee: Shanghai KOHLER Electronics, Ltd., Shanghai (CN)

( * ) Notice: Subject to any disclaimer, the term of this patent is extended or adjusted under 35 U.S.C. 154(b) by 972 days.

(21) Appl. No.: 17/951,354

(22) Filed: Sep. 23, 2022

(65) Prior Publication Data

US 2023/0097894 A1      Mar. 30, 2023

(30) Foreign Application Priority Data

Sep. 24, 2021    (CN) .......................... 202122324680.0

(51) Int. Cl.
| | |
|---|---|
| *F24H 3/02* | (2022.01) |
| *F24H 9/20* | (2022.01) |
| *H05K 1/02* | (2006.01) |
| *H05K 7/20* | (2006.01) |
| *E03D 9/052* | (2006.01) |

(52) U.S. Cl.
CPC ........... *F24H 3/022* (2013.01); *F24H 9/2071* (2013.01); *H05K 1/0203* (2013.01); *H05K 7/20145* (2013.01); *E03D 9/052* (2013.01); *F24H 2250/02* (2013.01)

(58) Field of Classification Search
None
See application file for complete search history.

(56) References Cited

U.S. PATENT DOCUMENTS

| | | | | | |
|---|---|---|---|---|---|
| 3,571,663 | A | * | 3/1971 | Hungate | ............. H01L 23/4006 |
| | | | | | 361/717 |
| 3,955,122 | A | * | 5/1976 | Maynard | ................. H01L 24/72 |
| | | | | | 257/722 |
| 4,088,869 | A | * | 5/1978 | Nopanen | .............. H05B 1/0252 |
| | | | | | 34/97 |
| 4,196,343 | A | * | 4/1980 | Han | ....................... A45D 20/30 |
| | | | | | 200/332.2 |

(Continued)

FOREIGN PATENT DOCUMENTS

| | | | | | |
|---|---|---|---|---|---|
| EP | | 3096587 A1 | * | 11/2016 | ............... H05B 3/06 |
| WO | WO-03086018 A1 | | * | 10/2003 | ........... F24H 3/0441 |

*Primary Examiner* — Thor S Campbell
(74) *Attorney, Agent, or Firm* — Lempia Summerfield Katz LLC

(57) ABSTRACT

The present disclosure provides a driving part of a warm air heater and the warm air heater, wherein the driving part comprises a driving circuit board, and a silicon-controlled element is arranged on the driving circuit board; the driving circuit board is arranged in an air duct of the warm air heater, and the driving circuit board is positioned at the upstream of the heating part or is flush with the heating part, wherein the upstream or the flush is based on the direction of air flow in the air duct. The driving part of the present disclosure utilizes the fan to cool the silicon-controlled element without adding large-area radiating fins, thus reducing the cost of the driving part, and the driving circuit board is not arranged on the main control circuit board anymore, thus realizing the miniaturization of the main control part.

20 Claims, 3 Drawing Sheets

(56) References Cited

U.S. PATENT DOCUMENTS

| | | | | | |
|---|---|---|---|---|---|
| 4,876,435 | A | * | 10/1989 | Hawkins | A47K 10/48 |
| | | | | | 392/363 |
| 5,146,695 | A | * | 9/1992 | Yang | A47K 10/48 |
| | | | | | 34/90 |
| 5,557,704 | A | * | 9/1996 | Dennis | D06F 39/04 |
| | | | | | 392/458 |
| 5,568,691 | A | * | 10/1996 | Rubin | A45D 20/30 |
| | | | | | 392/380 |
| 5,612,849 | A | * | 3/1997 | Prehodka | H05F 3/04 |
| | | | | | 361/213 |
| 5,805,767 | A | * | 9/1998 | Jouas | F24H 9/2071 |
| | | | | | 392/360 |
| 5,884,008 | A | * | 3/1999 | Goldberg | A45D 20/12 |
| | | | | | 219/202 |
| 6,144,013 | A | * | 11/2000 | Chu | H05K 5/0212 |
| | | | | | 392/416 |
| 6,640,049 | B1 | * | 10/2003 | Lee | A45D 20/08 |
| | | | | | 34/96 |
| 6,732,449 | B2 | * | 5/2004 | Evanyk | A45D 20/12 |
| | | | | | 34/96 |
| 6,784,775 | B2 | * | 8/2004 | Mandell | A45D 20/12 |
| | | | | | 335/206 |
| 6,987,250 | B2 | * | 1/2006 | Levy | F24F 6/00 |
| | | | | | 219/508 |
| 7,119,308 | B2 | * | 10/2006 | Kopel | G05D 23/1928 |
| | | | | | 219/494 |
| 7,203,416 | B2 | * | 4/2007 | Craw | F24H 3/0411 |
| | | | | | 392/350 |
| 8,285,127 | B2 | * | 10/2012 | Mulder | F24F 11/70 |
| | | | | | 392/347 |
| 2005/0121986 | A1 | * | 6/2005 | Matsuki | H05K 1/0203 |
| | | | | | 310/58 |
| 2009/0262503 | A1 | * | 10/2009 | Kaneko | H05K 7/026 |
| | | | | | 361/705 |
| 2009/0285567 | A1 | * | 11/2009 | Searle | F24H 3/0417 |
| | | | | | 392/371 |
| 2010/0080539 | A1 | * | 4/2010 | Lo | H05B 1/0252 |
| | | | | | 392/383 |
| 2011/0091190 | A1 | * | 4/2011 | Blum | H05B 1/0236 |
| | | | | | 392/465 |
| 2013/0028579 | A1 | * | 1/2013 | Irrera | F24H 3/0411 |
| | | | | | 29/592.1 |
| 2014/0105586 | A1 | * | 4/2014 | Gallet | F24H 1/101 |
| | | | | | 392/465 |
| 2014/0190034 | A1 | * | 7/2014 | Farrall, Sr. | F26B 9/003 |
| | | | | | 34/232 |
| 2015/0108117 | A1 | * | 4/2015 | Gries | H05B 1/0236 |
| | | | | | 219/539 |
| 2018/0172266 | A1 | * | 6/2018 | Folk | F24H 15/414 |
| 2019/0046003 | A1 | * | 2/2019 | Ryan | H01H 21/22 |
| 2019/0226495 | A1 | * | 7/2019 | Kanai | H02K 5/18 |

* cited by examiner

30B

30A

30C

DRIVING PART OF WARM AIR HEATER AND WARM AIR HEATER

CROSS-REFERENCE TO RELATED APPLICATION

This application claims the benefit of priority to Chinese Patent Application No. 202122324680.0, filed in the Chinese Intellectual Property Office on Sep. 24, 2021, which is hereby incorporated by reference in its entirety.

FIELD

The present disclosure belongs to the technical field of intelligent toilets and particularly relates to a driving part of a warm air heater and the warm air heater.

BACKGROUND

At present, most intelligent toilet bowls are configured with the warm air heater. A driving circuit of the warm air heater is shown in FIG. 1, and the driving circuit is usually disposed on a main control circuit board of an intelligent toilet bowl. A heater block J is disposed near an export in a warm air heater wind channel. The driving circuit can drive the electric current change in the heater block J and change the temperature of the heater block J. Cold wind is blown out from the export in a wind channel after being heated by the heater block J.

As shown in the figures, the driving circuit comprises a thyristor TR, and a power of the warm air heater is higher, typically 150-300 W, which requires that the driving circuit itself also has a higher power. Thus, the excessively high power may cause the temperature of the thyristor TR in the driving circuit to be too high and cause the problems of thermal breakdown failure of the thyristor, and the like. In order to avoid the problem that the temperature of the thyristor is too high, as shown in FIG. 2, a large-area heat sink 2 is disposed on a printed circuit board PCB 1 on which the thyristor is disposed, so as to improve the heat dissipation efficiency and solve the problem of heat dissipation of the thyristor. However, because the driving circuit is disposed on the main control circuit board (i.e., the PCB 1 needs to be disposed on the main control circuit board) and the space of the installation position of the main control circuit board is limited, it is difficult to dispose a large-area heat sink. Even if the heat dissipation of the thyristor is improved by disposing the large-area heat sink, the dissipated heat is also collected in the installation space of the main control circuit board. Thus, the overall internal temperature of the space may be increased, and the working performance of the main control circuit board may be adversely affected.

SUMMARY

The present disclosure aims to solve the technical problem that a thyristor in a driving circuit of the existing warm air heater has poor heat dissipation effect and provides a driving part of the warm air heater and the warm air heater.

To this end, one aspect of the present disclosure provides a driving part of a warm air heater, including a driving circuit board provided with a silicon-controlled element.

The driving circuit board is arranged in an air duct of the warm air heater, and the driving circuit board is positioned at the upstream of the heating part or is leveled with the heating part. The terms "upstream" and "leveled" means an upstream and a level relative to an airflow direction in the air duct.

In an embodiment, when the driving circuit board is disposed on the inner wall of the air duct, the silicon-controlled element (e.g., a silicon-controlled rectifier or a thyristor) is located on the airflow path of the air duct.

In an embodiment, the driving part of the warm air heater further includes a fixing piece used for fixing the driving circuit board on the inner wall of the air duct.

In an embodiment, the driving part of the warm air heater further includes a sealing adhesive layer arranged on the surface of the driving circuit board and disposed between the driving circuit board and the inner wall of the air duct.

In an embodiment, the silicon-controlled element is provided with a heat sink or a heat radiating fin.

Another aspect of the present disclosure also provides a warm air heater, including a fan, an air duct, a heating part, and any of the driving parts as described above.

The heating part and the driving circuit board of the driving part are disposed in the air duct or a wind channel. The driving circuit board is located at the upstream of the heating part or leveled with the heating part relative to the airflow direction.

In an embodiment, the heating element includes at least one of a heating coil, a heating wire, or a ceramic heater.

In an embodiment, an accommodating cavity is formed in the air duct at a position corresponding to the driving circuit board, and the driving circuit board is disposed in the accommodating cavity.

In an embodiment, the warm air heater further includes a sealing adhesive layer obtained by pouring colloid into the accommodating cavity.

In an embodiment, the air duct includes a first assembly and a second assembly, a connecting portion of one of the first assembly and the second assembly comprises a slot or a groove and a connecting portion of the other of the first assembly and the second assembly comprises teeth, and the teeth are connected with the slot or the groove in a matching manner.

Compared with the prior art, the present disclosure at least has the following beneficial effects: the driving circuit board of the driving part is disposed in the air duct and is located at the upstream of the heating part or leveled with the heating part, and thus the cold wind from the fan can directly cool down the silicon-controlled element on the driving circuit board. The driving part of the present disclosure utilizes the fan to cool the silicon-controlled element and thus can realize good cooling effect without adding large heat radiating fins and can reduce the costs of the driving part. In addition, the driving circuit board needs not to be disposed on a main control circuit board and thus the space to install the main control circuit board may be saved and the size of main control circuit board may be minimized.

DETAILED DESCRIPTION

Figure 1:
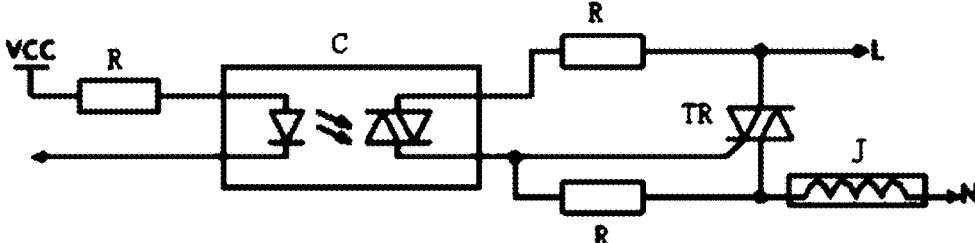
FIG. 1 is a schematic circuit diagram of a driving part of a warm air heater.
Figure 2:
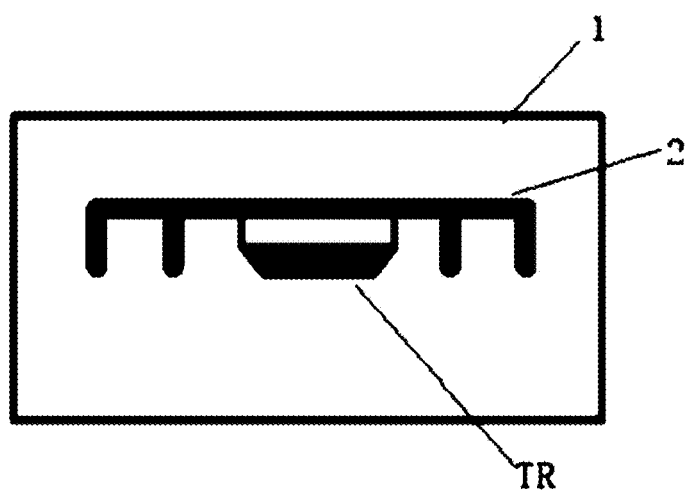
FIG. 2 is a schematic diagram of a large area of a heat sink for a silicon-controlled element.

The embodiments of the present disclosure are further described with reference to the accompanying drawings. In the description of the present disclosure, it should be noted that the terms "center", "upper", "lower", "left", "right", "vertical", "horizontal", "inner", "outer", etc., indicate orientations or positional relationships based on the orientations or positional relationships shown in the drawings. These terms are used only for convenience of description of the present disclosure and do not indicate or imply that the devices or assemblies must have a specific orientation or must be constructed and operated in a specific orientation. Thus, these terms should not be construed as limiting the present disclosure. Furthermore, the terms "first," "second," and "third" are used for descriptive purposes only and should not construed as indicating or implying relative importance. The terms "first position" and "second position" are two different positions.

In an embodiment, a driving part of a warm air heater includes a driving circuit board on which a silicon-controlled element (e.g., a silicon-controlled rectifier or a thyristor TR) is disposed, with reference to the structures as shown in FIG. 3-FIG. 6. FIG. 1 shows a circuit principle of the driving part. A heating part J is disposed near an outlet of an air duct 300, and the electrical connection between the driving circuit board and the heating part J remain the same. As shown in FIG. 3-FIG. 6, the air duct 300 comprises a first mounting position 302 for disposing the driving circuit board and a second mounting position 303 for disposing the heating part J. The driving circuit board is located at the upstream of the heating part J or is leveled with the heating part J. The terms "upstream" and "leveled" means an upstream and a level relative to the airflow direction in the air duct 300.

Figure 3:
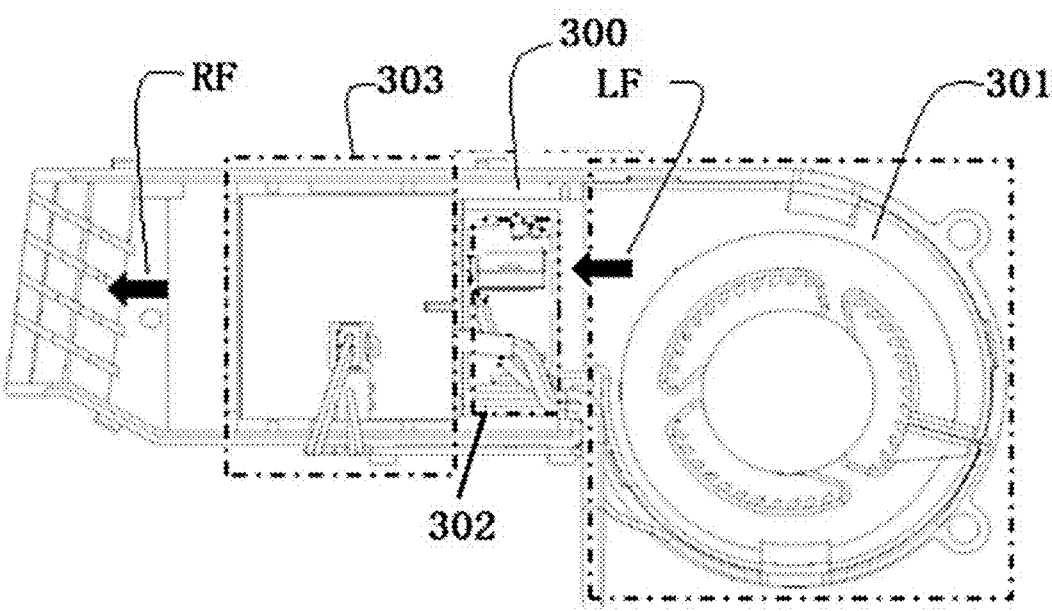
FIG. 3 is a schematic diagram illustrating a position of a driving part of the warm air heater in an air duct according to an embodiment of the present disclosure.
Figure 4:
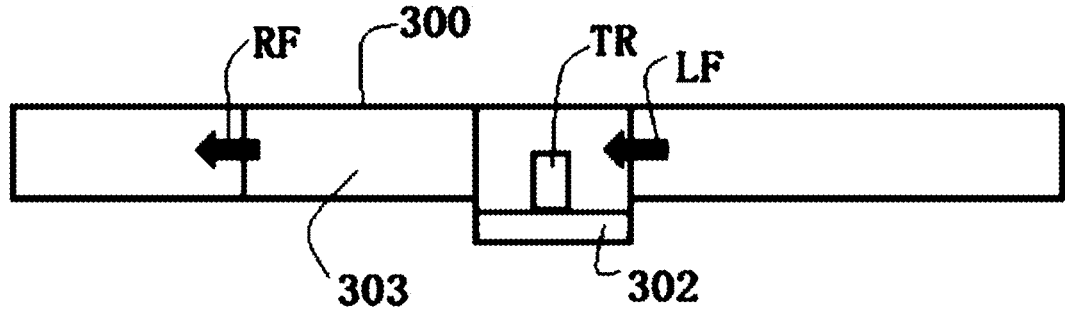
FIG. 4 is a schematic diagram of the airflow direction within the air duct as shown in FIG. 3.
Figure 5:
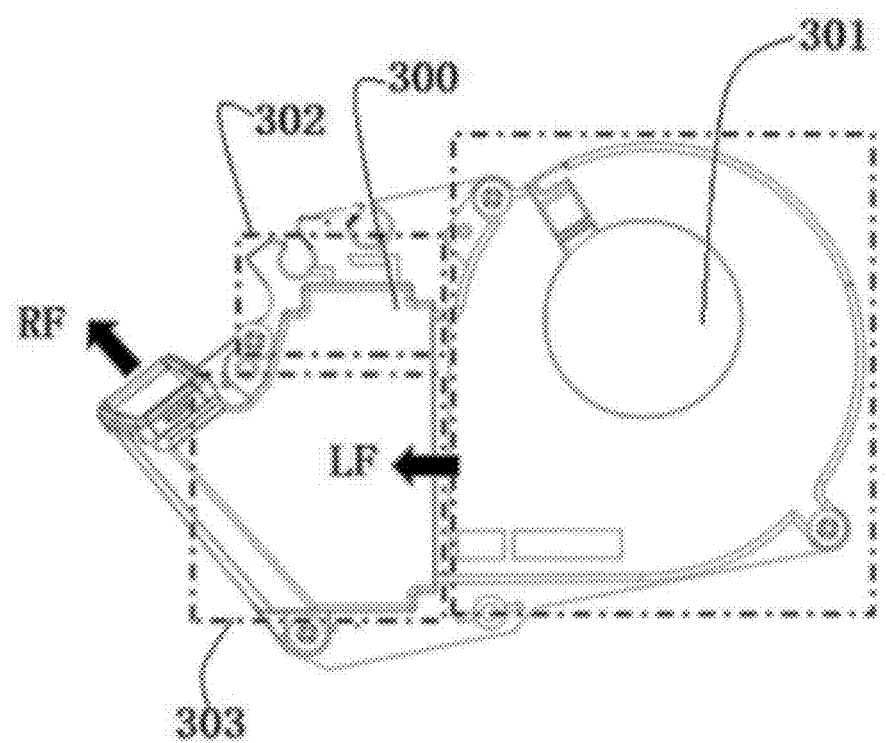
FIG. 5 is a schematic diagram illustrating a position of a driving part of the warm air heater in an air duct according to another embodiment of the present disclosure.
Figure 6:
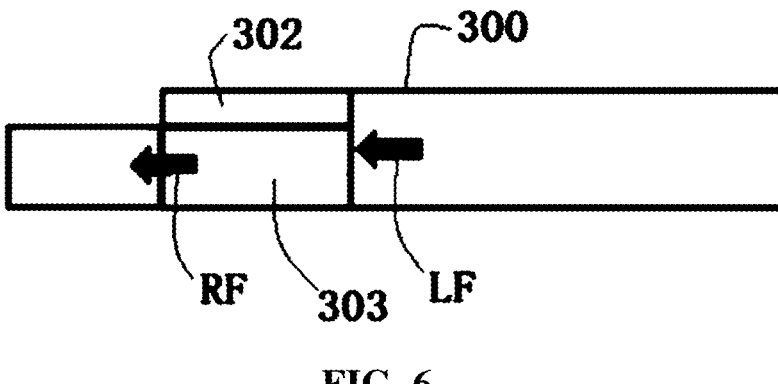
FIG. 6 is a schematic diagram of the airflow direction within the air duct as shown in FIG. 5.

In this embodiment, the relationships among a fan 301, the first mounting position 302, and the second mounting position 303 can be determined by referring to FIG. 4 and FIG. 6. In FIG. 3 and FIG. 4, the fan 301 blows out cold wind LF back, and the cold wind LF passes through the first mounted position 302 and then the second mounted position 303. The cold wind LF becomes warm wind RF after being heated by the heating part J. Thus, the heat in the thyristor TR at the first mounting position 302 can be dispelled under the effect of cold wind LF. The radiating effect is outstanding. The heat in the thyristor TR can be blown out along the air duct 300 without staying at the first mounting position 302 of the thyristor TR. In FIG. 5 and FIG. 6, after the fan 301 blows out the cold wind LF, the cold wind LF simultaneously passes through the first mounting position 302 and then the second mounting position 303. The cold wind LF is heated by the heating part J when passing through the second mounting position 303 and becomes warm wind RF. Thus, the thyristor TR at the first mounting position 302 still is acted on by the cold wind LF, can the heat can be dispelled under the effect of the cold wind LF. The heat in the thyristor TR can be blown out along the wind channel 300 without staying at the first mounting position 302 of the thyristor TR.

In this embodiment, the driving circuit board including the thyristor TR is disposed in the air duct 300, and the driving circuit board is disposed at the upstream of the heating part or leveled with the heating part. Thus, the cold wind from the fan 301 can directly cool down the silicon-controlled element on the driving circuit board. The driving part of the present disclosure utilizes the fan 301 to cool down the silicon-controlled element and thus can realize good cooling effect without adding large heat radiating fins and can reduce the costs of the driving part. In addition, the driving circuit board needs not to be disposed on a main control circuit board and thus the space to install the main control circuit board may be saved and the size of main control circuit board may be minimized.

It should be understood that the structure of the warm air heater shown in the above drawings is a schematic view from an external perspective. The driving circuit board described in the embodiments of the present disclosure is disposed inside the air duct 300. The driving circuit board only needs to be disposed at an appropriate position at an upstream or leveled position of the heating part J and is not described in detail in the drawings of the present disclosure.

In an embodiment, when the driving circuit board is disposed on the inner wall of the air duct 300, the thyristor TR is disposed in the air duct 300, i.e., in an airflow passage. Because the area occupied by the silicon-controlled element (e.g., the silicon-controlled rectifier or the thyristor TR) is very small, the silicon-controlled element does not have great influence on the wind speed even if the silicon-controlled element is arranged in the airflow passage. The silicon-controlled element can be cooled down better in the airflow passage.

In an embodiment, the driving part further includes a fixing piece, which may be a screw, configured to fix the driving circuit board to the inner wall of the air duct 300. In an embodiment, the driving part further comprises a sealing adhesive layer disposed on a surface of the driving circuit board and between the driving circuit board and the inner wall of the air duct 300. The driving circuit board can be disposed at a sinking position or in a accommodating cavity of the air duct 300. The sealing adhesive layer can be obtained by pouring the sealing adhesive or colloid into the sinking position or the accommodating cavity. The sealing adhesive layer can be rubber, ethylene propylene diene monomer rubber, and the like. The sealing adhesive layer may not only realize the fixation of the driving circuit board, but also prevent the driving circuit board from being affected by damp.

Further, in the driving part of the warm air heater as described above, the silicon-controlled element is provided with a heat sink or a heat radiating fin. The size of the heat sink or the heat radiating fin does not need to be too large but only needs to be matched with the surface area of the thyristor TR. The heat sink or the heat radiating fin can improve the radiating efficiency of silicon-controlled element. Moreover, the air duct 300 has the internal space larger than a mounting space of the main control circuit board and thus cannot cause any inconvenience for setting up the heat sink or the heat radiating fin.

In an embodiment, the present disclosure further provides a warm air heater, which includes a fan 301, an air duct 300, a heating part, and the driving part described in any of the above embodiments. The heating part and the driving circuit board of the driving part are both arranged in the air duct 300. The driving circuit board in the air duct 300 is located at the upstream of the heating part or is leveled with the heating part. The terms "upstream" and "leveled" means an upstream and a level relative to the airflow direction in the air duct 300. As described in the foregoing embodiments, when the warm air heater provided by these embodiments heats the cold air blown out of the fan 301, a large amount of cold air in the air duct 300 plays a role in cooling down the silicon-controlled element (e.g., the silicon-controlled rectifier or the thyristor TR) and dissipating the heat from the silicon-controlled element disposed on the driving circuit board. Such a configuration is beneficial to fully utilizing the internal space of the air duct 300 and solves the problem that the occupied internal space is too large due to the large size of the heat radiating fin additionally arranged at the installation position of the main control circuit board. Such a configuration is beneficial to the modular design of a warm air heating control device and reduces the design costs.

In the above embodiments, the heating part includes but is not limited to a heating coil, a heating wire, or a ceramic heater, so that the product can be adapted to different air duct shapes and structures and thus has stronger adaptability.

In an embodiment, in the above warm air heater, an accommodating cavity is formed in the air duct 300 at a position corresponding to the driving circuit board, and the driving circuit board is disposed in the accommodating cavity. In other words, the casing of the air duct 300 is designed to be protruded at a position to form a sinking portion where the driving circuit board is installed, so that the driving circuit board is installed at the sinking portion. The pouring of colloid may be conveniently conducted to prevent the driving circuit board from damp or moisture. Thus, the warm air heater further includes: a sealing adhesive layer obtained by pouring colloid into the accommodating cavity. The sealing adhesive layer has the effects of preventing corrosion and isolating damp and is also beneficial to fixing the driving circuit board.

In an embodiment, in the warm air heater in the above scheme, the air duct 300 is provided with a through-hole configured to allow a wire, e.g., a signal line or a power line, to pass through. Because the driving circuit board needs to receive signals transmitted on the main control circuit board, the driving circuit board needs to be connected with the main control circuit board through signal lines, power lines, and the like. In order to simplify the wire connection, the wire connection may be implemented from the outside of the air duct 300 by allowing the signal line and/or the strong current line to pass through the through-hole.

Figure 7:
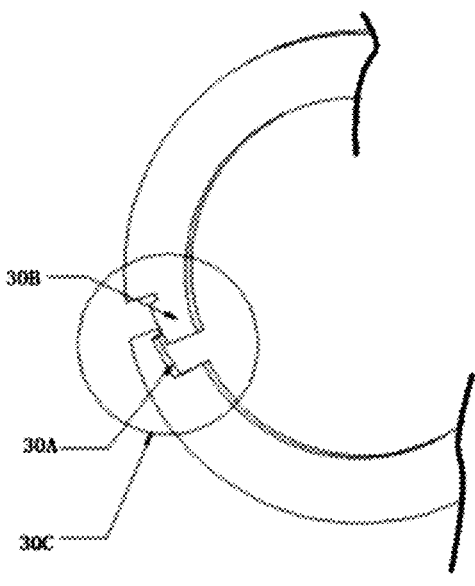
FIG. 7 is a schematic structural view of a connecting portion of an air duct according to an embodiment of the present disclosure.

In an embodiment, the air duct 300 of the warm air heater, as shown in FIG. 7, includes a first assembly 30A and a second assembly 30B, and a groove and a tooth are respectively formed at a connecting portion of the first assembly 30A and a connecting portion of the second assembly 30B, respectively. The tooth is connected to or engaged with the groove in a matching manner. As can be seen from FIG. 7, the joint portion 30C is assembled together by the first assembly 30A and the second assembly 30B in a manner similar to a bayonet or snap fitting, so that the obtained air duct 300 has extremely strong sealing performance. If water drops are present on the outer wall of the air duct 300 and the water drops slide to the joint portion 30C, the water drops cannot invade into the air duct 300, so that electronic components inside the air duct 300 can be well protected.

Finally, it should be noted that the above examples are only intended to illustrate the technical solution of the present disclosure, but not to limit the technical solution. Although the present disclosure has been described in detail with reference to the foregoing embodiments, it should be understood by those of ordinary skill in the art that the technical solutions described in the foregoing embodiments may still be modified. Some technical features may be equivalently replaced or substituted. The modifications or the substitutions do not make the essence of the corresponding technical solutions depart from the scope of the technical solutions of the embodiments of the present disclosure.

We claim:

1. A driving part of a warm air heater, comprising:
   a driving circuit board configured to be disposed in an air duct of the warm air heater and configured to be disposed at an upstream of a heating part of the warm air heater or leveled with the heating part of the warm air heater;
   a silicon-controlled element disposed on the driving circuit board,
   wherein the driving circuit board is disposed at an upstream of the heating part of the warm air heater or leveled with the heating part of the warm air heater relative to an airflow direction in the air duct,
   wherein the air duct includes a first assembly and a second assembly, and
   wherein a connecting portion of one of the first assembly and the second assembly comprises a groove and a connecting portion of the other of the first assembly and the second assembly comprises teeth, and the teeth are engaged with the groove.

2. The driving part of the heater of claim 1,
   wherein when the driving circuit board is disposed on an inner wall of the air duct, the silicon-controlled element is disposed on an airflow passage of the air duct.

3. The driving part of the heater of claim 2, further comprising:
   a fixing piece configured to fix the driving circuit board on the inner wall of the air duct.

4. The driving part of the heater of claim 1, further comprising:
   a sealing adhesive layer disposed on a surface of the driving circuit board and disposed between the driving circuit board and the inner wall of the air duct.

5. The driving part of the heater of claim 4,
   wherein the driving circuit board is configured to be disposed in an accommodating cavity of the air duct, and
   wherein the sealing adhesive layer is poured into the accommodating cavity.

6. The driving part of the warm air heater according to claim 1, further comprising:
   a heat radiating fin disposed on the silicon-controlled element.

7. The driving part of the warm air heater according to claim 6,
   wherein the heat radiating fin has a size matched with a size of the silicon-controlled element.

8. The driving part of the warm air heater according to claim 1,
   wherein the driving circuit board is configured to be disposed at a downstream of a fan, and
   wherein the fan configured to blow cold wind to cool down the silicon-controlled element disposed on the driving circuit board.

9. The driving part of the warm air heater according to claim 6,
   wherein the heating part of the warm air heater is disposed in the air duct, and
   wherein the cold wind blown from the heat radiating fin travels along the air duct to first cool down the silicon-controlled element and then to be heated by the heating part to become warm wind.

10. A warm air heater, comprising:

a fan, an air duct, a heating part disposed in the air duct, and a driving part, comprising:

a driving circuit board disposed in the air duct and disposed at an upstream of the heating part or leveled with the heating part;

a silicon-controlled element disposed on the driving circuit board, wherein the driving circuit board is disposed at an upstream of the heating part or leveled with the heating part relative to an airflow direction in the air duct, wherein the air duct includes a first assembly and a second assembly, and wherein a connecting portion of one of the first assembly and the second assembly comprises a groove and a connecting portion of the other of the first assembly and the second assembly comprises teeth, and the teeth are engaged with the groove.

11. The warm air heater according to claim 10, wherein the heating part comprises at least one of a heating coil, a heating wire, or a ceramic heater.

12. The warm air heater according to claim 10, wherein the air duct comprises an accommodating cavity disposed at a position corresponding to the driving circuit board, and wherein the driving circuit board is disposed in the accommodating cavity.

13. The warm air heater according to claim 12, further comprising:

a sealing adhesive layer formed by pouring colloid into the accommodating cavity.

14. The warm air heater according to claim 10, wherein the air duct comprises at least one through-hole configured to allow a wire to pass through, and wherein the wire is configured to transmit signals between the driving circuit board and a main control circuit board.

15. The warm air heater according to claim 10, further comprising a heat radiating fin disposed on the silicon-controlled element.

16. The warm air heater according to claim 15, wherein the heat radiating fin has a size matched with a size of the silicon-controlled element.

17. The warm air heater according to claim 10, wherein the driving circuit board is configured to be disposed at a downstream of a fan, wherein the fan is configured to blow cold wind to cool down the silicon-controlled element disposed on the driving circuit board.

18. The warm air heater according to claim 15, wherein the heating part of the warm air heater is disposed in the air duct, and wherein the cold wind blown from the heat radiating fin travels along the air duct to first cool down the silicon-controlled element and then to be heated by the heating part to become warm wind.

19. The warm air heater according to claim 10, wherein when the driving circuit board is disposed on an inner wall of the air duct, the silicon-controlled element is disposed on an airflow passage of the air duct.

20. A toilet comprising:

a warm air heater including:

a driving circuit board configured to be disposed in an air duct of the warm air heater and configured to be disposed at an upstream of a heating part of the warm air heater or leveled with the heating part of the warm air heater;

a silicon-controlled element disposed on the driving circuit board, wherein the driving circuit board is disposed at an upstream of the heating part of the warm air heater or leveled with the heating part of the warm air heater relative to an airflow direction in the air duct, wherein the air duct includes a first assembly and a second assembly, and wherein a connecting portion of one of the first assembly and the second assembly comprises a groove and a connecting portion of the other of the first assembly and the second assembly comprises teeth, and the teeth are engaged with the groove.

\* \* \* \* \*